United States Patent
Chen

(10) Patent No.: US 8,624,134 B2
(45) Date of Patent: Jan. 7, 2014

(54) PACKAGE OF ENVIRONMENTAL SENSITIVE ELEMENT AND ENCAPSULATION METHOD OF THE SAME

(75) Inventor: Kuang-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 412 days.

(21) Appl. No.: 12/944,691

(22) Filed: Nov. 11, 2010

(65) Prior Publication Data

US 2012/0024722 A1 Feb. 2, 2012

(30) Foreign Application Priority Data

Jul. 29, 2010 (TW) ................ 99125118 A

(51) Int. Cl.
*H01L 23/28* (2006.01)

(52) U.S. Cl.
USPC .......... 174/523; 174/521; 174/254; 257/443; 257/40

(58) Field of Classification Search
USPC ........................... 174/521, 523, 524
See application file for complete search history.

(56) References Cited

U.S. PATENT DOCUMENTS

| | | | |
|---|---|---|---|
| 5,091,233 A | 2/1992 | Kirby et al. | |
| 5,920,020 A | 7/1999 | Korupp | |
| 5,920,080 A | 7/1999 | Jones | |
| 6,226,890 B1 | 5/2001 | Boroson et al. | |
| 6,465,953 B1 | 10/2002 | Duggal | |
| 6,561,666 B2 | 5/2003 | Park | |
| 6,576,351 B2 | 6/2003 | Silvernail | |
| 6,740,145 B2 | 5/2004 | Boroson et al. | |
| 6,835,950 B2 | 12/2004 | Brown et al. | |
| 6,866,901 B2 | 3/2005 | Burrows et al. | |

(Continued)

FOREIGN PATENT DOCUMENTS

| | | |
|---|---|---|
| TW | 570472 | 1/2004 |
| TW | I232693 | 5/2005 |

(Continued)

OTHER PUBLICATIONS

Lee et al., "Effect of transparent film desiccant on the lifetime of top-emitting active matrix organic light emitting diodes", Applied Physics Letters 90, 103518 (2007), Mar. 2007, pp. 1-3.

(Continued)

*Primary Examiner* — Tuan T Dinh
*Assistant Examiner* — Steven Sawyer
(74) *Attorney, Agent, or Firm* — Jianq Chyun IP Office

(57) ABSTRACT

An encapsulation method of an environmental sensitive element is provided. An environmental sensitive element and a first rib are formed on a first substrate. The first rib surrounds the environmentally sensitive element. A getter layer is formed on the environmental sensitive element. A first encapsulation layer is formed to encapsulate the getter layer and the first rib. The first barrier layer is formed to encapsulate the first encapsulation layer located on the first rib. The first rib, a portion of the first encapsulation layer located on the first rib and the first barrier layer form a barrier structure. A second substrate is provided on the first substrate and a filling layer is formed between the first substrate and the second substrate. The second substrate is bonded to the first substrate by the filling layer. The filling layer encapsulates the environmental sensitive element, the first encapsulation layer and the barrier structure.

19 Claims, 13 Drawing Sheets

(56) References Cited

U.S. PATENT DOCUMENTS

| | | | |
|---|---|---|---|
| 6,873,102 B2 | 3/2005 | Martelli et al. | |
| 6,897,474 B2 | 5/2005 | Brown et al. | |
| 6,998,648 B2 | 2/2006 | Silvernail | |
| 7,211,881 B2 | 5/2007 | McKinnell et al. | |
| 7,224,116 B2 | 5/2007 | Stegamat | |
| 8,093,512 B2 | 1/2012 | Chen et al. | |
| 2003/0038590 A1 | 2/2003 | Silvernail et al. | |
| 2003/0122476 A1 | 7/2003 | Wang et al. | |
| 2004/0048037 A1 | 3/2004 | Klausmann et al. | |
| 2004/0081852 A1 | 4/2004 | Chen et al. | |
| 2004/0160178 A1* | 8/2004 | Qiu et al. | 313/512 |
| 2005/0045900 A1* | 3/2005 | Silvernail | 257/99 |
| 2005/0238803 A1 | 10/2005 | Tremel et al. | |
| 2005/0249901 A1 | 11/2005 | Yializis et al. | |
| 2006/0060086 A1 | 3/2006 | Wang et al. | |
| 2006/0072308 A1 | 4/2006 | Booty, Jr. | |
| 2006/0076632 A1 | 4/2006 | Palmateer et al. | |
| 2006/0076634 A1 | 4/2006 | Palmateer et al. | |
| 2006/0087230 A1 | 4/2006 | Ghosh et al. | |
| 2006/0226523 A1 | 10/2006 | Foust et al. | |
| 2007/0014916 A1* | 1/2007 | Daniels | 427/66 |
| 2007/0172971 A1 | 7/2007 | Boroson | |
| 2008/0006819 A1 | 1/2008 | McCormick et al. | |
| 2008/0079349 A1 | 4/2008 | Miyazaki et al. | |
| 2010/0148661 A1 | 6/2010 | Farquhar et al. | |
| 2011/0135884 A1* | 6/2011 | Lettow et al. | 428/174 |

FOREIGN PATENT DOCUMENTS

| | | |
|---|---|---|
| TW | 200603416 | 1/2006 |
| TW | I257269 | 6/2006 |
| TW | 201037799 | 10/2010 |

OTHER PUBLICATIONS

Song et al., "New hybrid encapsulation for flexible organic light-emitting devices on plastic substrates", Chinese Science Bulletin, Mar. 2008, vol. 53, No. 6, pp. 958-960.

Williams et al., "Flat-plate encapsulation solution for OLED displays using a printed getter," Journal of the Society for Information Display 15 (2), Feb. 2007, pp. 103-112.

"Office Action of Taiwan counterpart application" issued on Apr. 29, 2013, p. 1-p. 5, in which the listed references were cited.

* cited by examiner

PACKAGE OF ENVIRONMENTAL SENSITIVE ELEMENT AND ENCAPSULATION METHOD OF THE SAME

CROSS-REFERENCE TO RELATED APPLICATION

This application claims the priority benefit of Taiwan application serial no. 99125118, filed on Jul. 29, 2010. The entirety of the above-mentioned patent application is hereby incorporated by reference herein and made a part of this specification.

BACKGROUND

1. Field of the Disclosure

The disclosure relates to a package and an encapsulation method thereof. Particularly, the disclosure relates to a package of an environmental sensitive element and an encapsulation method thereof.

2. Description of Related Art

Application of flexible substrates is broader compared to that of rigid substrates, and the flexible substrates have advantages of flexibility, easy to carry, safety, and wide application, though they have shortages of poor heat resistance, poor water and oxygen resistance, poor chemical resistance and large thermal expansion coefficient, etc. Since typical flexible substrates cannot effectively resist penetration of moisture and oxygen, aging of components within the substrates is accelerated, so that lifetime of the components is shortened, which cannot meet a commercial requirement.

To resolve the above problem, a plurality of ameliorating methods has been provided by conventional techniques, for example, methods disclosed by U.S. Pat. Nos. 6,740,145, 6,835,950, 2006/0072308 and 6,998,648.

The U.S. Pat. No. 6,740,145 discloses a method that a cover lid of an organic light-emitting diode (OLED) is used to place a getter structure, according to such method, the getter structure is fabricated on the cover lid through adhesion, so that the fabricated product is not flexible. Moreover, the U.S. Pat. No. 6,835,950 and the U.S. Pat. No. 6,998,648 also disclose an OLED device having a getter structure that is fabricated according to a pressure sensitive adhesives (PSA) method.

The U.S. Patent No. 2006/0072308 discloses a transparent getter structure of an OLED device. In such structure, the getter structure has to be transparent, and the device disclosed by this patent is not a completely solid structure, so that if the non-completely solid structure is bended, the OLED device may be damaged.

SUMMARY OF THE DISCLOSURE

The disclosure is directed to a package of an environmental sensitive element and an encapsulation method thereof, by which reduction of lifetime of the environmental sensitive element caused by penetration of moisture and oxygen can be mitigated, and the package and the encapsulation method are suitable for mass production.

The disclosure provides an encapsulation method of an environmental sensitive element, which can be described as follows. The environmental sensitive element and a first rib are formed on a first substrate, wherein the first rib surrounds the environmentally sensitive element. A getter layer is formed on the environmental sensitive element. A first encapsulation layer is formed simultaneously to encapsulate the getter layer and the first rib. A first barrier layer is formed to encapsulate the first encapsulation layer located on the first rib, wherein the first rib, a portion of the first encapsulation layer located on the first rib and the first barrier layer form a barrier structure. A second substrate is provided on the first substrate, and a filling layer is formed between the first substrate and the second substrate, wherein the second substrate is bonded to the first substrate by the filling layer. The filling layer encapsulates the environmental sensitive element, a portion of the first encapsulation layer and the barrier structure.

The disclosure provides a package of an environmental sensitive element, which is adapted to be folded along at least one predetermined fold line. The package of the environmental sensitive element includes a first substrate, a package material, the environmental sensitive element and a getter layer. The package material is disposed above the first substrate. The environmental sensitive element is disposed on the first substrate, and is located between the first substrate and the package material, wherein the package material encapsulates the environmental sensitive element. The getter layer is embedded in the package material, and the getter layer is not located on the predetermined fold line.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1B' is a cross-sectional view of a package of an environmental sensitive element according to an exemplary embodiment of the disclosure.

FIG. 5' is a cross-sectional view of a package of an environmental sensitive element according to still another exemplary embodiment of the disclosure.

DETAILED DESCRIPTION OF DISCLOSED EMBODIMENTS

Figure 1A:
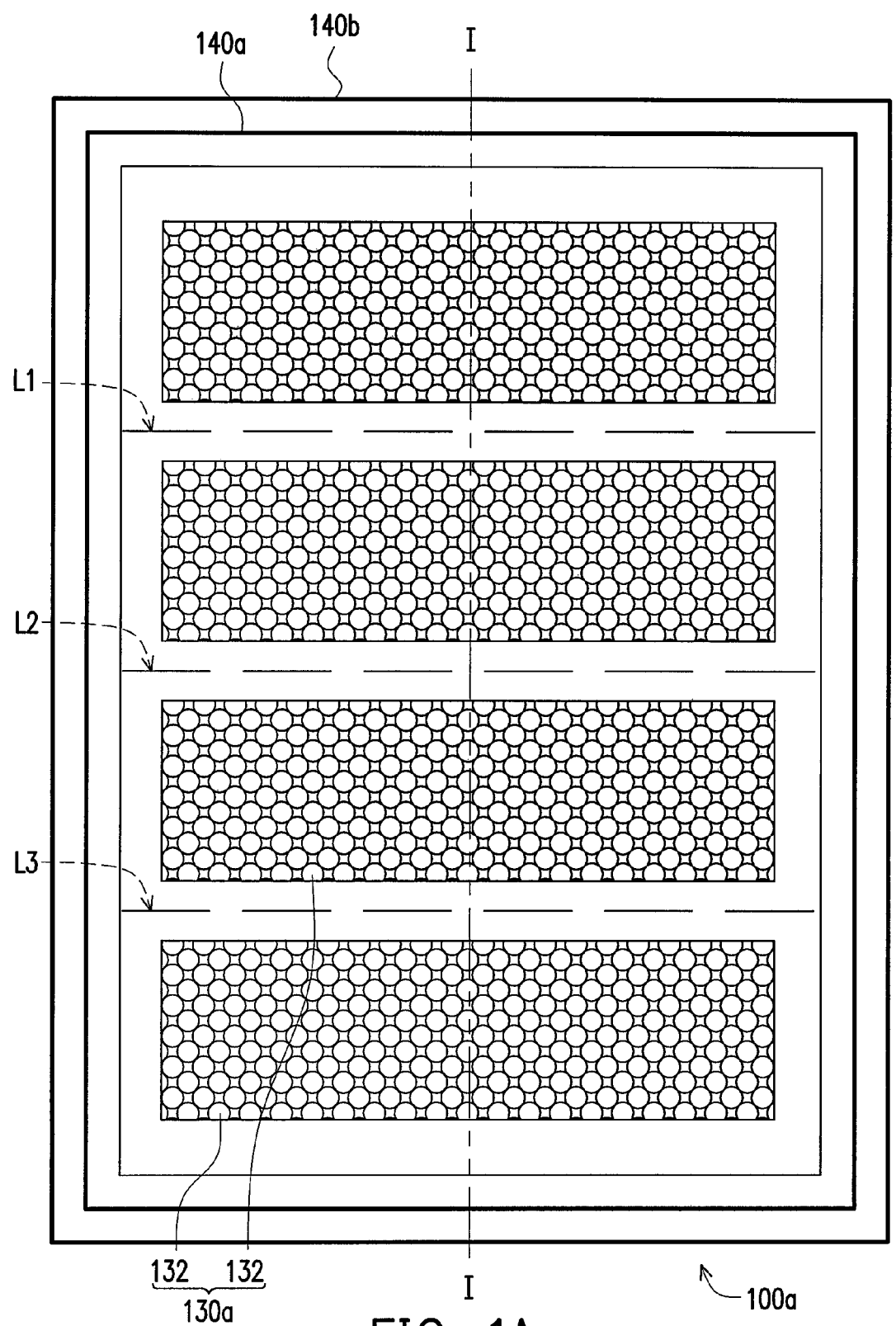
FIG. 1A is a top view of a package of an environmental sensitive element according to an exemplary embodiment of the disclosure.
Figure 1B:
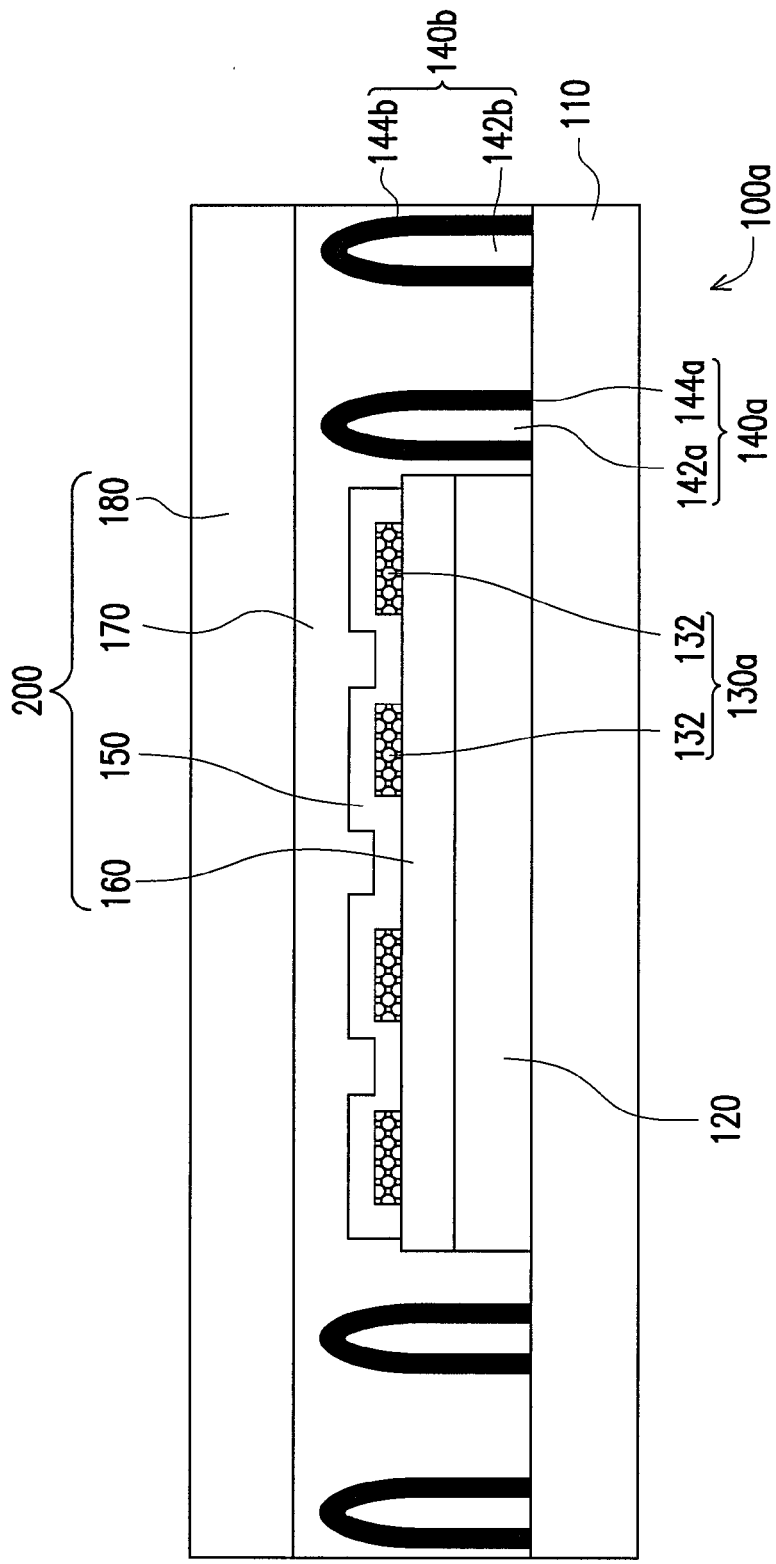
FIG. 1B is a cross-sectional view of FIG. 1A along an I-I line.
Figure 1B:
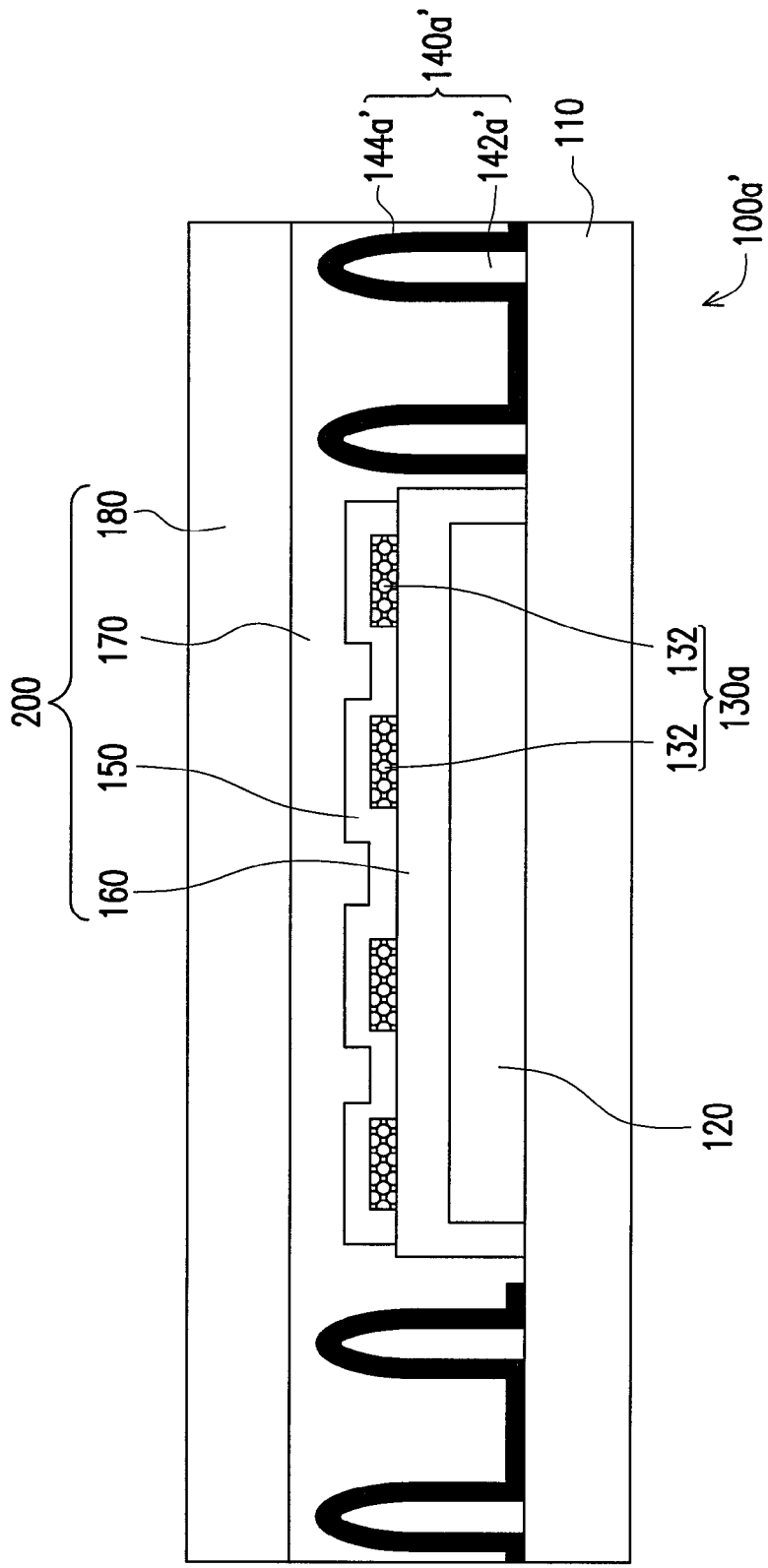

FIG. 1A is a top view of a package of an environmental sensitive element according to an exemplary embodiment of the disclosure. FIG. 1B is a cross-sectional view of FIG. 1A along an I-I line. Referring to FIG. 1A and FIG. 1B, in the present exemplary embodiment, the package 100a of the environmental sensitive element is adapted to be folded along at least one predetermined fold line (three fold lines L1, L2 and L3 are exemplarily illustrated in FIG. 1A), so that the package may have a smaller size for accommodation.

The package 100a of the environmental sensitive element includes a first substrate 110, a package material 200, an environmental sensitive element 120 and a getter layer 130a. In detail, the predetermined fold lines L1, L2 and L3 are parallel to sidewalls of the first substrate 110, and the package material 200 is disposed above the first substrate 110. The first substrate 110 is, for example, a flexible substrate, and a material thereof is, for example, PET, PEN, PES, PMMA, PC, PI or metal foil, and the flexible substrate can also be a substrate having a touch-sensing function, for example, a surface capacitive touch panel, a digital matrix touch panel (for example, a projection capacitive touch panel) or an analog matrix touch panel.

The package material 200 is, for example, formed by an encapsulation layer 150, a protection layer 160, a filling layer 170 and a second substrate 180, wherein the first substrate 110 is opposite to the second substrate 180. Certainly, in other embodiments that are not illustrated, the package material 200 can also be formed by stacking a plurality of organic multi layers and a plurality of inorganic multi layers. Namely, the environmental sensitive element 120 is encapsulated by a thin-film encapsulation. Therefore, the package material 200 of FIG. 1B is only used as an example, and the disclosure is not limited thereto.

The environmental sensitive element 120 is disposed on the first substrate 110, and is located between the first substrate 110 and the package material 200, wherein the package material 200 encapsulates the environmental sensitive element 120, and the protection layer 160 of the package material 200 is disposed on the environmental sensitive element 120 for directly encapsulating the environmental sensitive element 120. The environmental sensitive element 120 is, for example, an active environmental sensitive display element or a passive environmental sensitive display element, wherein the active environmental sensitive display element is, for example, an active matrix organic light emitting diode (AM-OLED), an active matrix electro phoretic display (AM-EPD) (which is generally referred as an E-paper), an active matrix liquid crystal display (AM-LCD), or an active matrix blue phase liquid crystal display, while the passive environmental sensitive display element is, for example, a passive matrix OLED (PM-OLED) array substrate or a super twisted nematic liquid crystal display (STN-LCD).

The getter layer 130a is embedded in the package material 200, and the getter layer 130a is not located on the predetermined fold lines L1, L2 and L3. Particularly, in the present exemplary embodiment, the getter layer 130a is, for example, a discontinuous pattern, and the discontinuous pattern is, for example, a plurality of strip patterns 132 separated from each other, and the strip patterns 132 are not located on the predetermined fold lines L1, L2 and L3. Moreover, a material of the getter layer 130a includes a moisture absorption material such as a mixture of Ca, CaO, $CaAl_2$, $BaAl_4$, $CaAl_2$ and Ni, or a mixture of $BaAl_4$ and Ni, or a Ca—Ba—Al alloy, etc.

The encapsulation layer 150 of the package material 200 is disposed on the getter layer 130a, and encapsulates the getter layer 130a, wherein the getter layer 130a is located between the encapsulation layer 150 and the protection layer 160. The filling layer 170 is located between the first substrate 110 and the second substrate 180, and encapsulates the environmental sensitive element 120. Moreover, a material of the encapsulation layer 150 includes a polymer material, for example, polytetrafluoroethylene (PTFE) or parylene, etc. A material of the filling layer 170 is, for example, acrylic or expoxy, and the filling layer 170 is, for example, a pressure sensitive adhesive or a fill-in adhesive.

Moreover, the package material 200 of the environmental sensitive element 120 further includes at least one first barrier structure (two first barrier structures 140a and 140b are illustrated in FIG. 1A and FIG. 1B), wherein the first barrier structures 140a and 140b are disposed between the first substrate 110 and the package material 200, and surround the environmental sensitive element 120. Further, the first barrier structures 140a and 140b respectively include first ribs 142a and 142b and first barrier layers 144a and 144b, wherein the first ribs 142a and 142b are disposed on the first substrate 110, and the first rib 142b surrounds the first rib 142a. The first barrier layers 144a and 144b encapsulate the first ribs 142a and 142b, and the package material 200 encapsulates the first barrier layers 144a and 144b.

Certainly, positions, shapes and a number of the first barrier structures 140a and 140b and a shape of the protection layer 160 are not limited by the disclosure. Although the first ribs 142a and 142b of the first barrier structures 140a and 140b are disposed on the first substrate 110, and the number of the first barrier structures 140a and 140b is two, in other embodiments, referring to FIG. 1B', a first barrier layer 144a' of a package 100a' of the environmental sensitive element 120 can also be extended to simultaneously encapsulate first ribs 142a' and a portion of the first substrate 110, and the protection layer 160 can also be extended to surround the environmental sensitive element 120. Alternatively, the first barrier structure 140a or the first barrier structure 140b can also be disposed on the second substrate 180, and the number of the first barrier structures can be increased or decreased according to an actual design requirement. As long as a structure design capable of resisting the moisture and the oxygen is achieved, it is belonged to a technical implementation of the disclosure without departing from the spirit and scope of the disclosure.

Figure 2A:
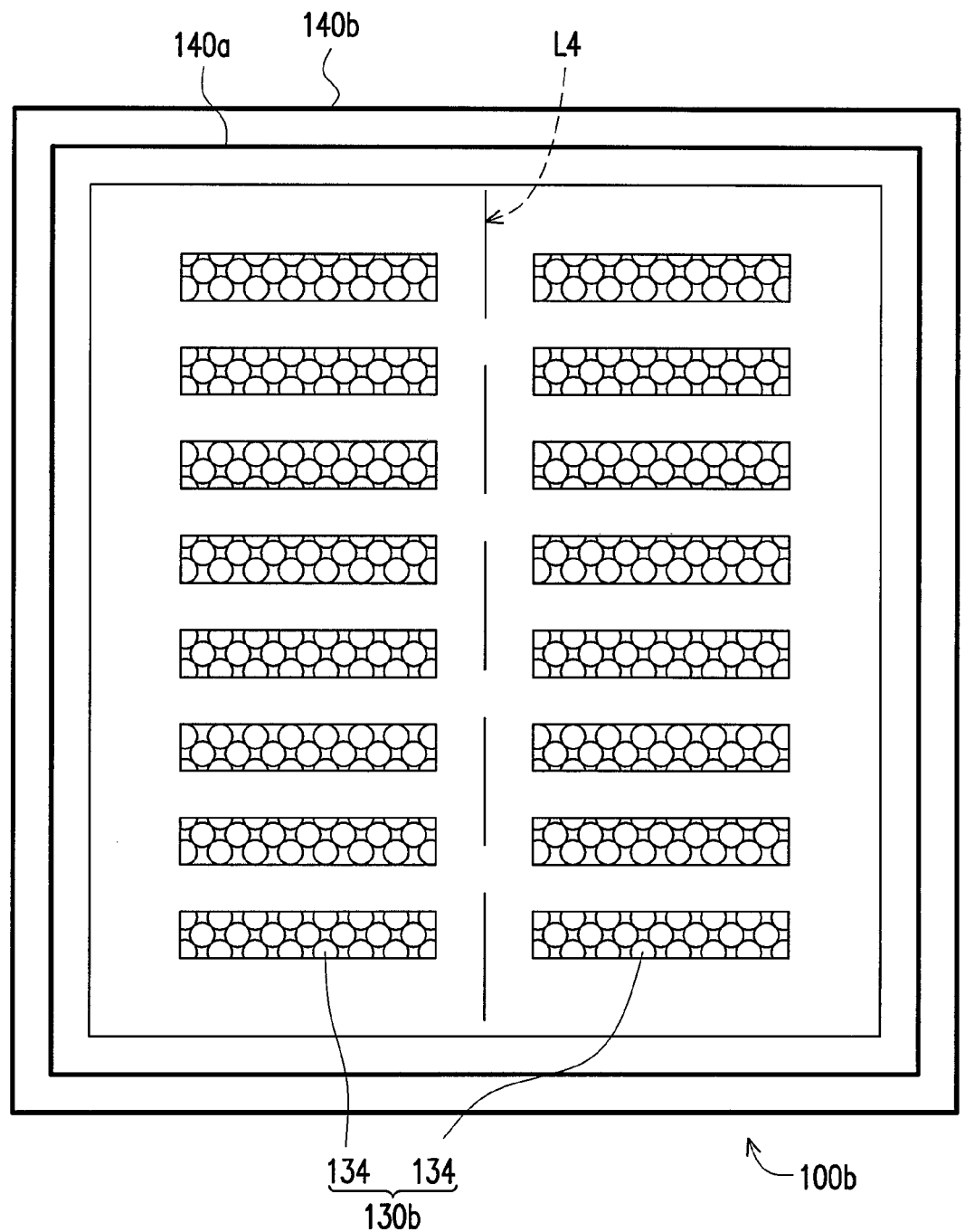
FIG. 2A is a top view of a package of an environmental sensitive element according to an exemplary embodiment of the disclosure.
Figure 2B:
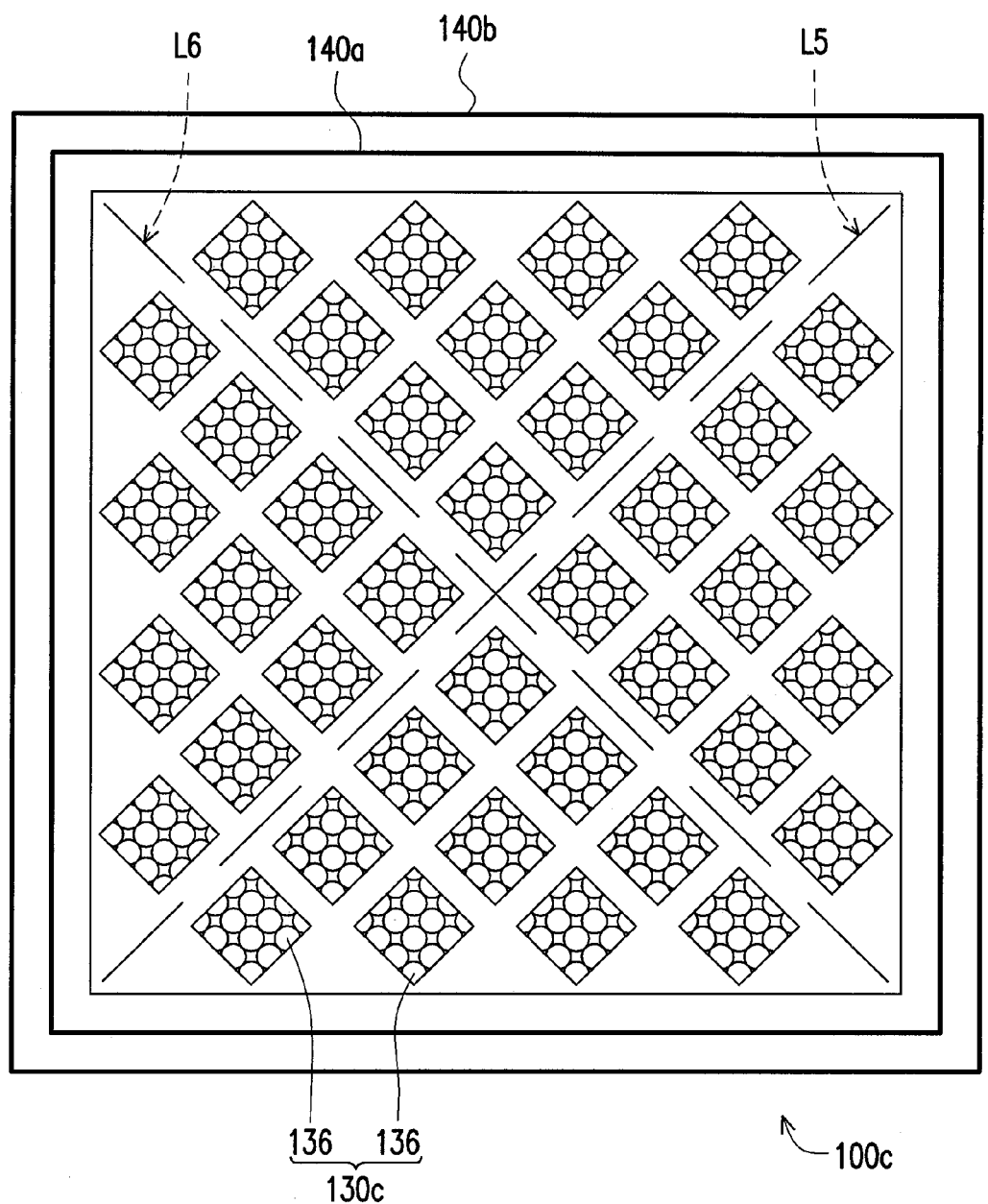
FIG. 2B is a top view of a package of an environmental sensitive element according to another exemplary embodiment of the disclosure.

It should be noted that shapes and a number of the predetermined fold lines L1, L2 and L3 and a shape of the getter layer 130a are not limited by the disclosure. Although the predetermined fold lines L1, L2 and L3 are parallel to the sidewalls of the first substrate 110, and the number of the predetermined fold lines L1, L2 and L3 are three, and the getter layer 130a are implemented by the strip patterns 132 separated from each other, in other embodiment, referring to FIG. 2A, the number of the predetermined fold line L4 can be only one, and a getter layer 130b is, for example, formed by a plurality of block patterns 134 separated from each other. Alternatively, referring to FIG. 2B, predetermined fold lines L5 and L6 are extended along diagonals of the first substrate 110, and a getter layer 130c is, for example, formed by a plurality of block patterns 136 separated from each other. Alternatively, in another embodiment that is not shown, the getter layer is, for example, form by a plurality of block patterns, circular patterns, oval patterns or other suitable patterns that are separated from each other. Therefore, the predetermined folded lines L1, L2 and L3 and the getter layer 130a of FIG. 1A are only used as an example, which are not used to limit the disclosure.

In brief, since the getter layer 130a is formed between the first substrate 110 and the package material 200, the package 100a of the environmental sensitive element 120 can effectively resist moisture and oxygen, so that lifetime of the environmental sensitive element 120 can be effectively prolonged. Moreover, the package 100a of the environmental sensitive element 120 is adapted to be folded along the predetermined fold lies L1, L2 and L3 (or the predetermined fold lines L4, L5 and L6), so that it has a smaller size for accommodation.

Different exemplary embodiments are provided below to describe an encapsulation method of the environmental sensitive element, and the encapsulation method of the environmental sensitive element is described in detail with reference of FIG. 3 to FIG. 8. It should be noted that reference numbers of the components and a part of contents of the aforementioned exemplary embodiments are also used in the following exemplary embodiments, wherein the same reference numbers denote the same or like components, and descriptions of the same technical contents are omitted. The aforementioned exemplary embodiments can be referred for descriptions of the omitted parts, so that detailed descriptions thereof are not repeated in the following exemplary embodiments.

Figure 3:
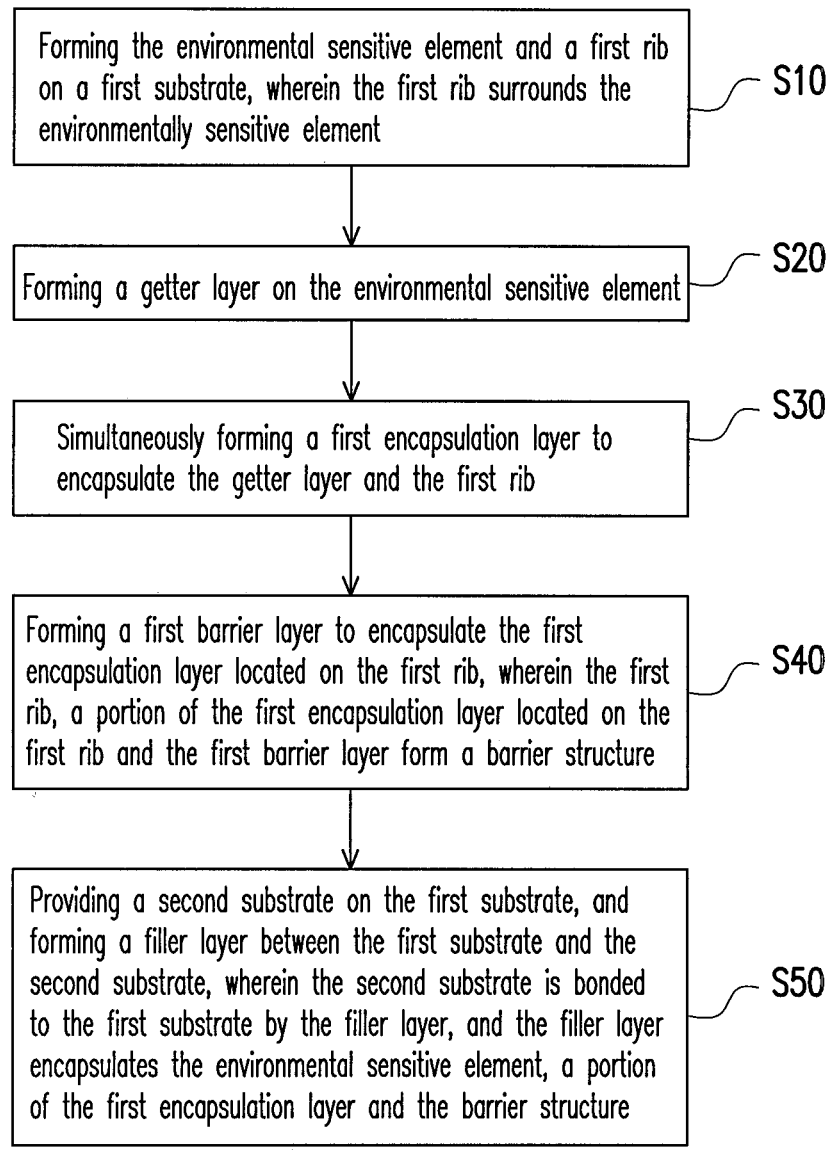
FIG. 3 is a flowchart illustrating an encapsulation method of an environmental sensitive element according to an exemplary embodiment of the disclosure.
Figure 4:
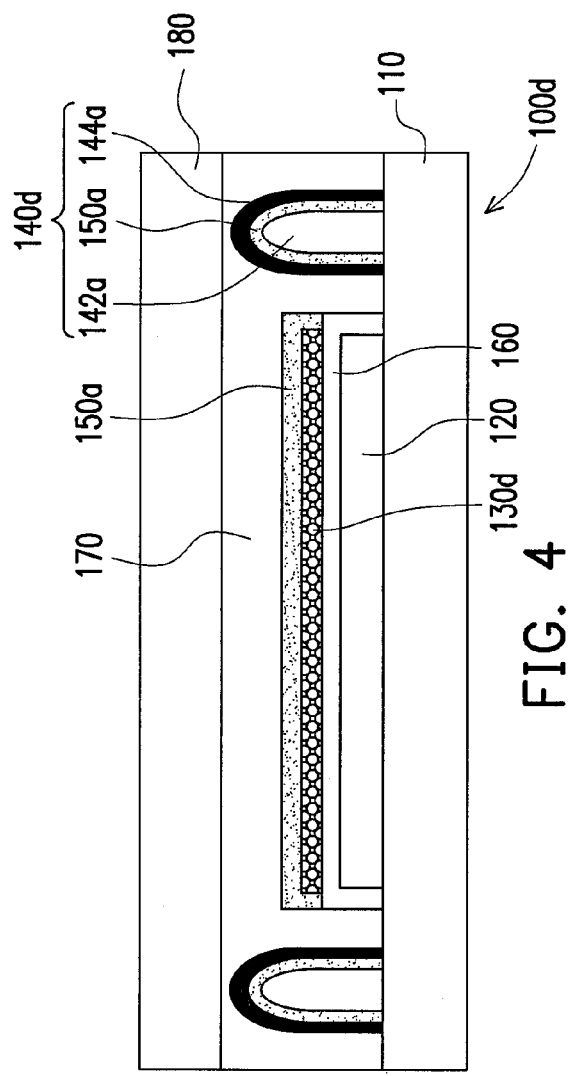
FIG. 4 is a cross-sectional view of a package of an environmental sensitive element according to another exemplary embodiment of the disclosure.

FIG. 3 is a flowchart illustrating an encapsulation method of an environmental sensitive element according to an exemplary embodiment of the disclosure. FIG. 4 is a cross-sectional view of a package of an environmental sensitive element according to another exemplary embodiment of the disclosure. Referring to FIG. 3 and FIG. 4, the encapsulation method of the environmental sensitive element includes following steps. First, in step S10, the environmental sensitive element 120 and the first rib 142a are formed on the first substrate 110, wherein the first rib 142a surrounds the environmentally sensitive element 120. It should be noted that in the present exemplary embodiment, the environmentally sensitive element 120 can be first formed, and then the first rib 142a is formed, alternatively, the first rib 142a can be first formed, and then the environmentally sensitive element 120 is formed, so that a sequence of forming the environmentally sensitive element 120 and the first rib 142a is not limited.

Then, referring to FIG. 4, the protection layer 160 is formed on the environmentally sensitive element 120, wherein the protection 160 encapsulates the environmentally sensitive element 120.

Then, in step S20, a getter layer 130d is formed on the environmental sensitive element 120, and a method of forming the getter layer 130d is, for example, a vacuum process. Particularly, in the present exemplary embodiment, the getter layer 130d has a continuous pattern, wherein the continuous pattern is, for example, a tortuous pattern, a grid-like pattern or a rectangular pattern, which is not limited by the disclosure. Moreover, a material of the getter layer 130d includes a moisture absorption material such as a mixture of Ca, CaO, $CaAl_2$, $BaAl_4$, $CaAl_2$ and Ni, or a mixture of $BaAl_4$ and Ni, or a Ca—Ba—Al alloy, etc.

Then, in step S30, a first encapsulation layer 150a is formed simultaneously to encapsulate the getter layer 130d and the first rib 142a. The getter layer 130d is located between the protection layer 160 and a portion of the first encapsulation layer 150a. A main purpose of forming the first encapsulation layer 150a is to increase flatness of a surface of the first rib 142a, so as to facilitate a moisture-resisting feature of the barrier layer 144a. Moreover, a method of forming the first encapsulation layer 150a includes a vacuum process, for example, chemical vapor deposition (CVD). A material of the first encapsulation layer 150a includes a polymer material, for example, polytetrafluoroethylene (PTFE) or parylene, etc.

Then, in step S40, the first barrier layer 144a is formed to encapsulate the first encapsulation layer 150a on the first rib 142a, wherein the first encapsulation layer 150a is located between the first rib 142a and the first barrier layer 144a. Particularly, the first rib 142a, a portion of the first encapsulation layer 150a located on the first rib 142a and the first barrier layer 144a form a first barrier structure 140d.

Then, in step S50, the second substrate 180 is provided on the first substrate 110, and the filling layer 170 is formed between the first substrate 110 and the second substrate 180, wherein the second substrate 180 is bonded to the first substrate 110 by the filling layer 170, and the filling layer 170 encapsulates the environmental sensitive element 120, a portion of the protection layer 160, a portion of the first encapsulation layer 150a and the first barrier structure 140d. By now, fabrication of the package 100d of the environmental sensitive element 120 is roughly completed.

It should be noted that since the filling layer 170 can be a fill-in adhesive or a pressure sensitive adhesive, in case that the filling layer 170 is the fill-in adhesive, a method of forming the filling layer 170 is as follows. First, an adhesive (not shown) is formed on the substrate 110 for encapsulating the environmental sensitive element 120 and the first barrier structure 140d. Then, the second substrate 180 is closely adhered to the first barrier structures 140d through a roller or frame pressing approach. Then, a curing process is performed to cure the adhesive to form the filling layer 170, wherein the adhesive is cured by ultraviolet irradiation or heat. In case that the filling layer 170 is the pressure sensitive adhesive, a method of forming the filling layer 170 is to attach a double-side adhesive (not shown) to the first substrate 110 for encapsulating the environmental sensitive element 120 and the first barrier structure 140d, and then the second substrate 180 is closely adhered to the first barrier structure 140d through a roller or frame pressing approach. In this way, fabrication of a package 100d of the environmental sensitive element 120 is completed.

In brief, the encapsulation method of the environmental sensitive element 120 is to simultaneously form the first encapsulation layer 150a onto the getter layer 130d and the first rib 142a, so that the fabrication steps can be reduced to facilitate a mass production. Moreover, the first encapsulation layer 150a encapsulates the first rib 142a to increase flatness of the surface of the first rib 142a, so that when the filling layer 170 is formed between the first substrate 110 and the second substrate 180, compactness of the filling layer 170 can be increased. In addition, since the first barrier structure 140d is disposed between the first substrate 110 and the second substrate 180 and surrounds the environmental sensitive element 120, the package 100d of the environmental sensitive element 120 can effectively resist moisture and oxygen, so that lifetime of the environmental sensitive element 120 can be effectively prolonged.

Certainly, the encapsulation method of FIG. 3 and FIG. 4 is only used as an example, and a part of the steps thereof are techniques commonly used in a current packaging process. Those skilled in the art can adjust, omit or increase possible steps according to an actual requirement, so as to cope with the fabrication requirement, and details thereof are not described herein.

Figure 5:
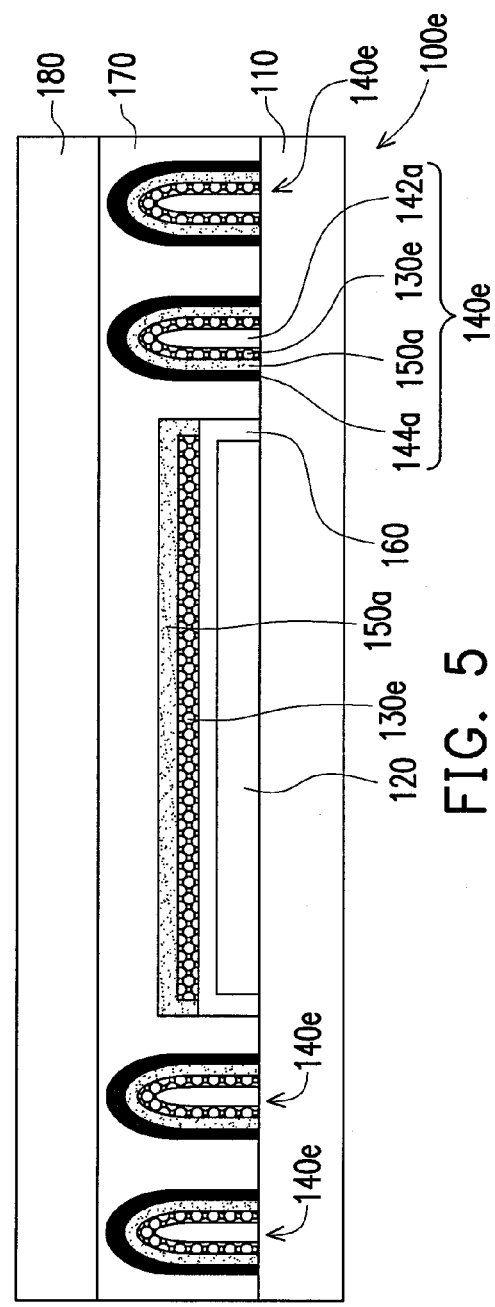
FIG. 5 is a cross-sectional view of a package of an environmental sensitive element according to another exemplary embodiment of the disclosure.
Figure 5:
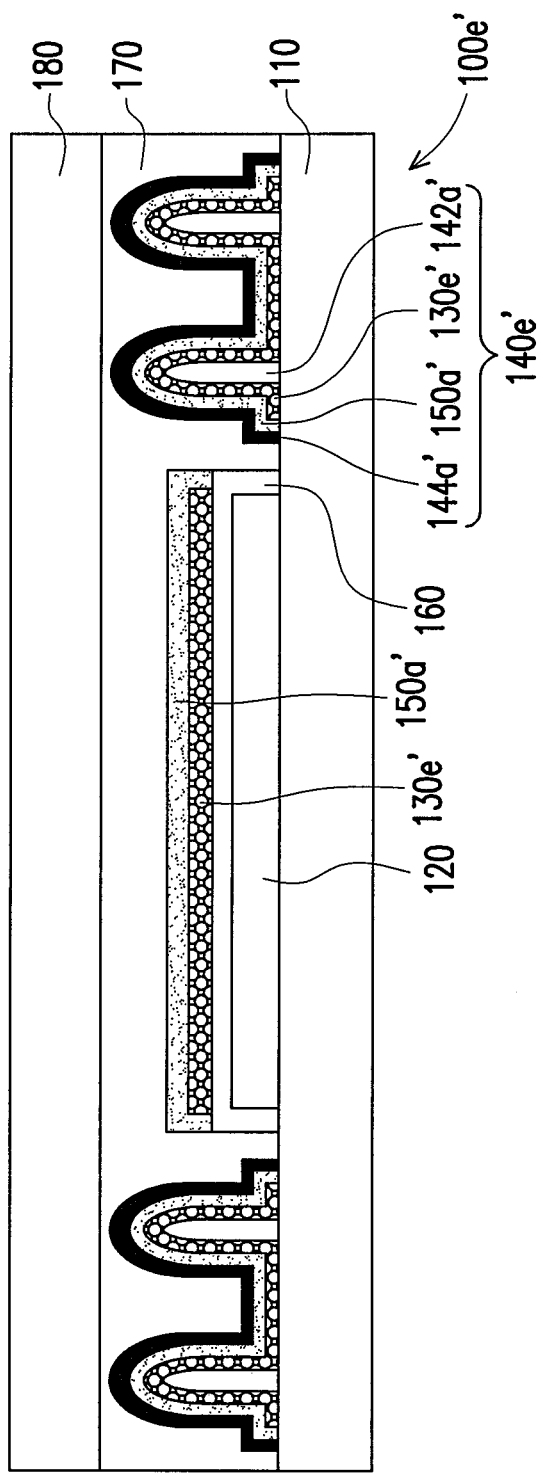

FIG. 5 is a cross-sectional view of a package of an environmental sensitive element according to another exemplary embodiment of the disclosure. Referring to FIG. 5, the package 100e of the environmental sensitive element of FIG. 5 is similar to the package 100d of the environmental sensitive element of FIG. 4, and a difference there between is that the package 100e of the environmental sensitive element of FIG. 5 has two first barrier structures 140e, and each of the first barrier structures 140e has a getter layer 130e, wherein the getter layer 130e is located between the first rib 142a and the first encapsulation layer 150a. Since the first barrier structures 140e have the getter layers 130e, the package 100e of the environmental sensitive element 120 can effectively resist moisture and oxygen, so that lifetime of the environmental sensitive element 120 can be effectively prolonged.

Regarding the fabrication process, fabrication steps of the package 100e of the environmental sensitive element can be similar to that of the package 100d of the environmental sensitive element of FIG. 4, and before the step S30, i.e. before the first encapsulation layer 150a is formed simultaneously, the getter layer 130e is formed simultaneously on the environmental sensitive element 120 and the first ribs 142a, wherein a portion of the getter layer 130e encapsulates the first ribs 142a. Then, the step S40 is executed, so that a portion of the getter layer 130e is located between the first ribs 142a and a portion of the first encapsulation layer 150a. Finally, the step S50 is executed to roughly complete fabricating the package 100e of the environmental sensitive element 120.

Certainly, shapes of the first barrier structures 140e are not limited by the disclosure. For example, referring to FIG. 5', in a package 100e' of the environmental sensitive element of FIG. 5', a getter layer 130e', a first encapsulation layer 150a' and a first barrier layer 144a' are all extended and stacked to cover the first ribs 142' and a portion of the first substrate 110. As long as a structure design capable of resisting the moisture and the oxygen is achieved, it is belonged to a technical implementation of the disclosure without departing from the spirit and scope of the disclosure.

Figure 6:
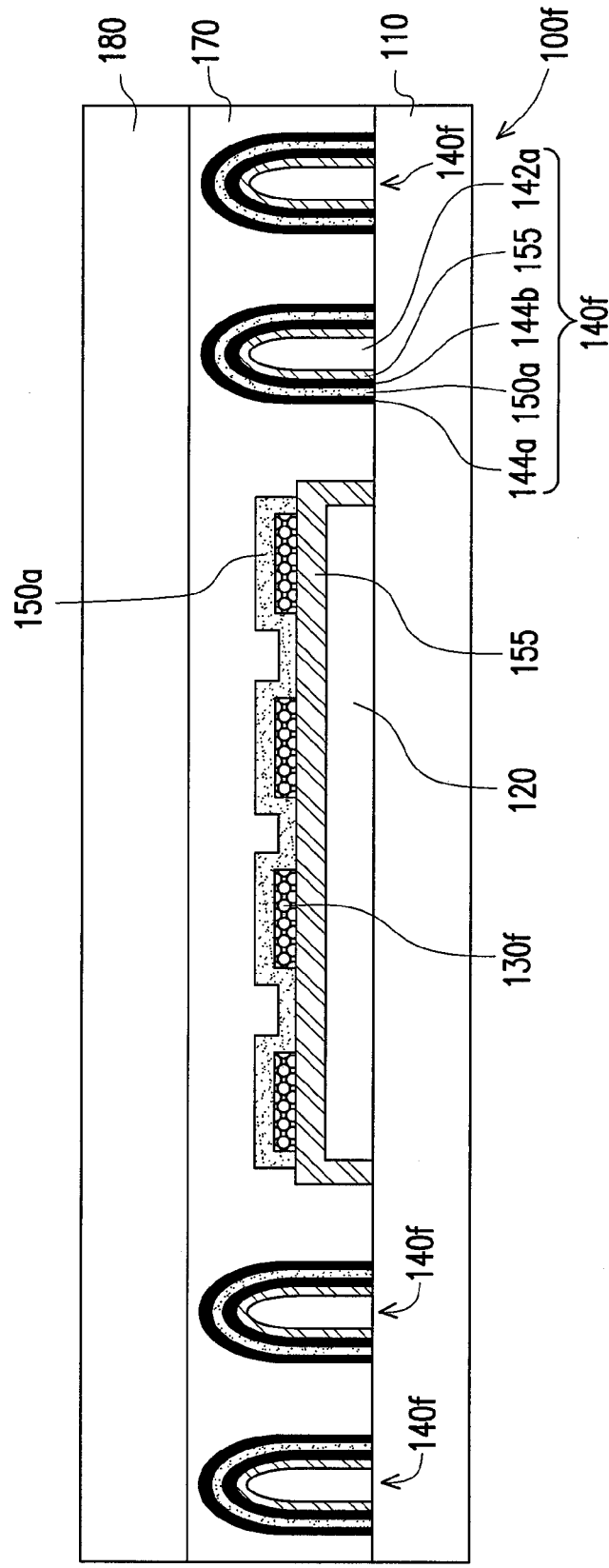
FIG. 6 is a cross-sectional view of a package of an environmental sensitive element according to still another exemplary embodiment of the disclosure.
Figure 6:
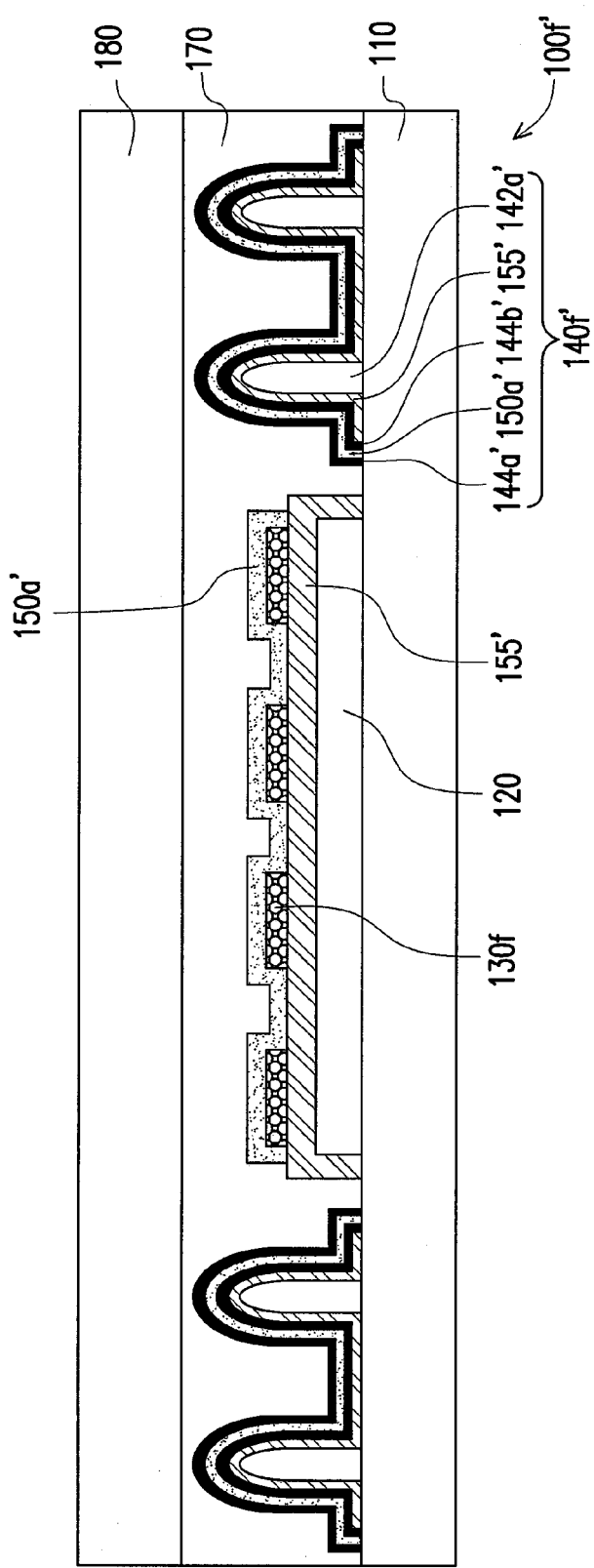

FIG. 6 is a cross-sectional view of a package of an environmental sensitive element according to still another exemplary embodiment of the disclosure. Referring to FIG. 6, the package 100f of the environmental sensitive element of FIG. 6 is similar to the package 100d of the environmental sensitive element of FIG. 4, and a difference there between is that a first barrier structure 140f of FIG. 6 does not include a getter layer 130f, but includes the first encapsulation layer 150a and a second encapsulation layer 155, and the getter layer 130f, for example, has a discontinuous pattern, and each of the first barrier structure 140f is formed by the first rib 142a, the second encapsulation layer 155, a second barrier layer 144b, the first encapsulation layer 150a and the first barrier layer 144a.

In detail, in the present exemplary embodiment, the second encapsulation layer 155 is disposed on the environmental sensitive element 120, wherein the getter layer 130f is located between the second encapsulation layer 155 and the first encapsulation layer 150a. The getter layer 130f, for example, has a discontinuous pattern, and the discontinuous pattern is, for example, formed by a plurality of strip patterns, block patterns, circular patterns, oval patterns or other suitable patterns that are separated from each other, which is not limited by the disclosure. The second encapsulation layer 155 of each of the first barrier structures 140f is located between the first rib 142a and the second barrier layer 144b, the second barrier layer 144b is located between the second encapsulation layer 155 and the first encapsulation layer 150a, and the first encapsulation layer 150a is located between the second barrier layer 144b and the first barrier layer 144a. Since the first barrier structures 140f have multi layers of the encapsulation layers (including the first encapsulation layer 150a and the second encapsulation layer 155) and multi layers of the barrier layers (including the first barrier layer 144a and the second barrier layer 144b), the package 100f of the environmental sensitive element can effectively resist moisture and oxygen, so that lifetime of the environmental sensitive element 120 can be effectively prolonged.

Regarding the fabrication process, fabrication steps of the package 100f of the environmental sensitive element can be similar to that of the package 100d of the environmental sensitive element of FIG. 4. In detail, the second encapsulating layer 155 is formed on the environmental sensitive element 120 and the first ribs 142, wherein a portion of the second encapsulation layer 155 encapsulate the first ribs 142a. Then, the getter layer 130f is formed on the second encapsulation layer 155 located on the environmental sensitive element 120, and then the second barrier layers 144b are formed on a portion of the second encapsulation layer 155 located on the first ribs 142a, wherein a portion of the second encapsulation layer 155 is located between the first ribs and the second barrier layers 144b. Then, the step S30 is executed, and the first encapsulation layer 150a is formed simultaneously on the getter layer 130f and the second barrier layers 144b. Then, the step S40 is executed, so that a portion of the first encapsulation layer 150a is located between the first barrier layers 144a and the second barrier layers 144b. Finally, the step S50 is executed to roughly complete fabricating the package 100f of the environmental sensitive element 120.

Certainly, shapes of the first barrier structures 140f are not limited by the disclosure. For example, referring to FIG. 6', in a package 100f of the environmental sensitive element of FIG. 6', a second encapsulation layer 155', a second barrier layer 144b', a first encapsulation layer 150a' and a first barrier layer 144a' are all extended and stacked to cover the first ribs 142' and a portion of the first substrate 110. As long as a structure design capable of resisting the moisture and the oxygen is achieved, it is belonged to a technical implementation of the disclosure without departing from the spirit and scope of the disclosure.

Figure 7:
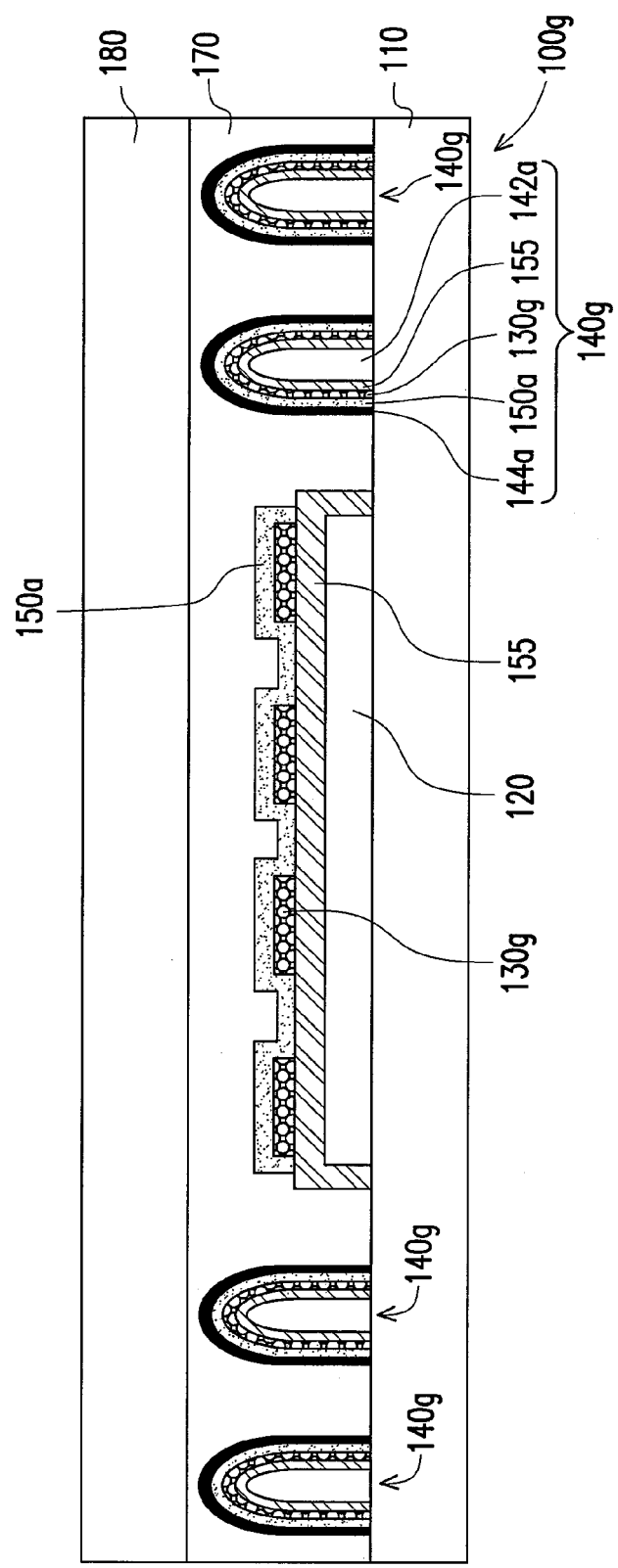
FIG. 7 is a cross-sectional view of a package of an environmental sensitive element according to still another exemplary embodiment of the disclosure.
Figure 7:
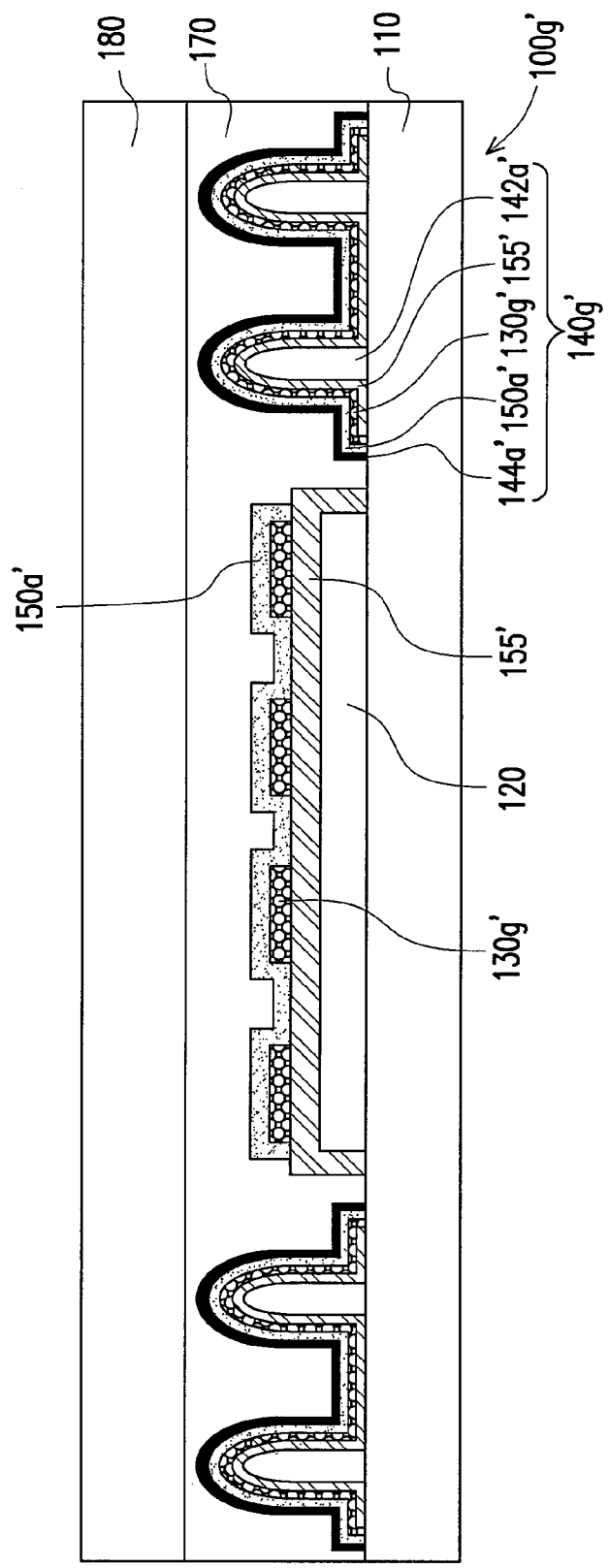

FIG. 7 is a cross-sectional view of a package of an environmental sensitive element according to still another exemplary embodiment of the disclosure. Referring to FIG. 7, the package 100g of the environmental sensitive element of FIG. 7 is similar to the package 100f of the environmental sensitive element of FIG. 6, and a difference there between is that the package 100g of the environmental sensitive element of FIG. 7 has a plurality of first barrier structures 140g, and each of the first barrier structures 140g has a getter layer 130g. In detail, each of the first barrier structures 140g is formed by the first rib 142a, the second encapsulation layer 155, the getter layer 130g, the first encapsulation layer 150a and the first barrier layer 144a. Wherein, the second encapsulation layer 155 is located between the first rib 142a and the getter layer 130g, the getter layer 130g is located between the second encapsulation layer 155 and the first encapsulation layer 150a, and the first encapsulation layer 150a is located between the getter layer 130g and the first barrier layer 144a. Since the first barrier structures 140g have multi layers of the encapsulation layers (including the first encapsulation layer 150a and the second encapsulation layer 155) and the getter layer 130g, the package 100g of the environmental sensitive element can effectively resist moisture and oxygen, so that lifetime of the environmental sensitive element 120 can be effectively prolonged.

Regarding the fabrication process, fabrication steps of the package 100g of the environmental sensitive element can be similar to that of the package 100f of the environmental sensitive element of FIG. 6. Before the step S30, i.e. before the first encapsulation layer 150a is formed simultaneously, the getter layer 130g is formed simultaneously on the second encapsulation layer 155 located on the environmental sensitive element 120 and the second encapsulation layer 155 located on the first ribs 142a. Then, the step S30 is executed, and the first encapsulation layer 150a is formed simultaneously on the getter layer 130g, wherein a portion of the first encapsulation layer 150a is located between the first barrier layers 144a and a portion of the getter layer 130g. Then, the steps S40 and S50 are sequentially executed to roughly complete fabricating the package 100g of the environmental sensitive element 120.

Certainly, shapes of the first barrier structures 140g are not limited by the disclosure. For example, referring to FIG. 7', in a package 100g' of the environmental sensitive element of FIG. 7', a second encapsulation layer 155', a getter layer 130g', a first encapsulation layer 150a' and a first barrier layer 144a' are all extended and stacked to cover the first ribs 142' and a portion of the first substrate 110. As long as a structure design capable of resisting the moisture and the oxygen is achieved, it is belonged to a technical implementation of the disclosure without departing from the spirit and scope of the disclosure.

Figure 8:
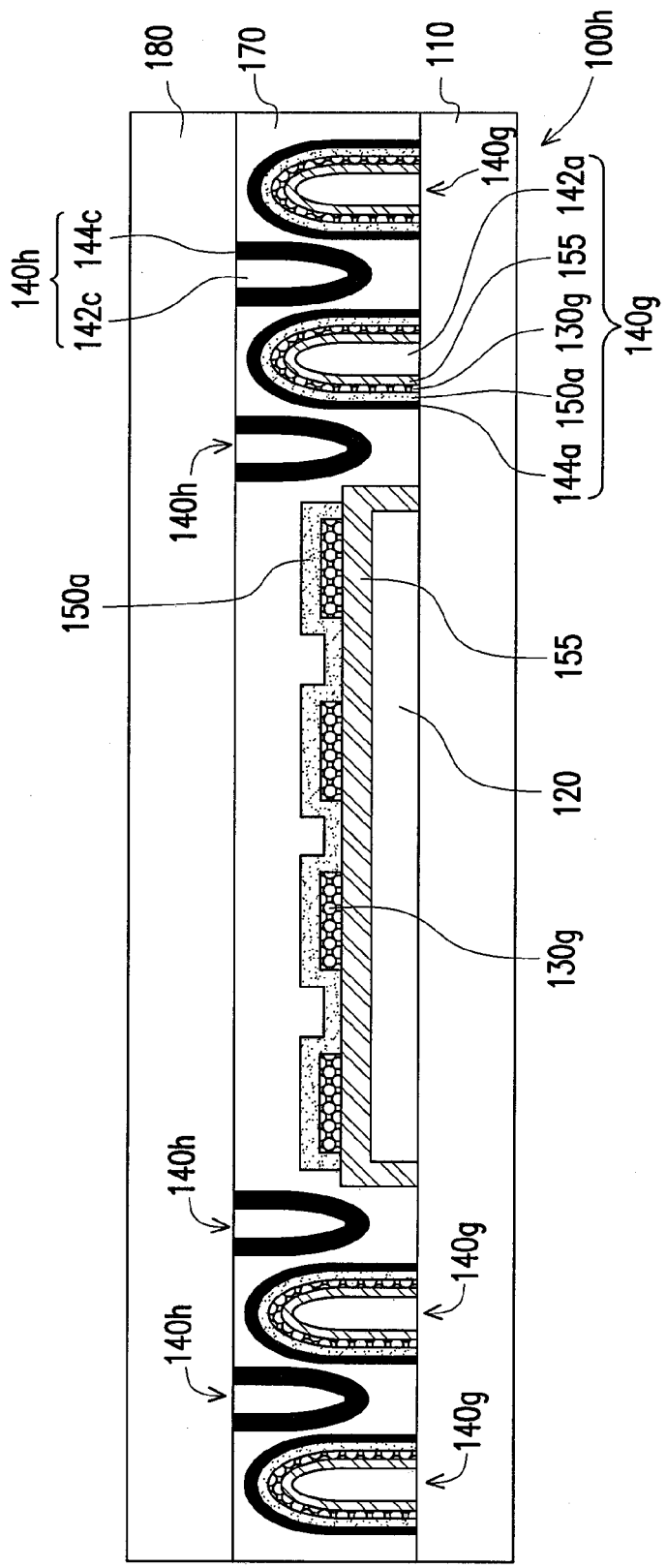
FIG. 8 is a cross-sectional view of a package of an environmental sensitive element according to an exemplary embodiment of the disclosure.

It should be noted that although the aforementioned barrier structures (for example, the first barrier structures 140a, 140b, 140d-140g) are formed on the first substrate 110, in other embodiments, referring to FIG. 8, the barrier structures, for example, a plurality of second barrier structures 140h can also be formed on the second substrate 180, i.e. a plurality of second ribs 142c of the second barrier structures 140h are formed on the second substrate 180, and a plurality of third barrier layers 144c encapsulates the second ribs 142c. The second ribs 142c surround the environmental sensitive element 120, and the second ribs 142c and the first ribs 142a are arranged alternately. Therefore, positions and configurations of the aforementioned barrier structures are only used as an example, which are not used to limit the disclosure.

Moreover, in other embodiment that are not illustrated, the barrier structures 140d-140g having the getter layers 130e and 130g, the first encapsulation layer 150a, the second encapsulation layer 155 or the second barrier layer 144b can also be used, and those skilled in the art can also selects the aforementioned components with reference of aforementioned descriptions according to an actual requirement, so as to achieve required technical effects.

In summary, since the getter layer is formed between the substrate and the package material, the package of the environmental sensitive element can effectively resist moisture and oxygen, so that lifetime of the environmental sensitive element can be prolonged. Moreover, the package of the environmental sensitive element is adapted to be folded along the predetermined fold lines, so that it may have a smaller size for accommodation. In addition, since a portion of the film layers above the environmental sensitive element and a portion of the film layers of the barrier structure can be formed simultaneously, manufacturing steps of the package can be effectively reduced, which avails a mass production.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An encapsulation method of an environmental sensitive element, comprising: forming the environmental sensitive element adapted to be folded along at least one fold line and a first rib on a first substrate, wherein the first rib surrounds the environmental sensitive element;
   forming a protection layer on the environmental sensitive element for encapsulating the environmental sensitive element;
   forming a getter layer on the environmental sensitive element, wherein the getter layer is not located on the fold line;
   forming a first encapsulation layer to encapsulate the getter layer and the first rib, wherein the getter layer is located between the protection layer and a portion of the first encapsulation layer; forming a first barrier layer to encapsulate a portion of the first encapsulation layer located on the first rib, wherein the first rib, the portion of the first encapsulation layer located on the first rib and the first barrier layer form a barrier structure; and providing a second substrate on the first substrate, and forming a filling layer between the first substrate and the second substrate, wherein the second substrate is bonded to the first substrate by the filling layer, and the filling layer encapsulates the environmental sensitive element, the first encapsulation layer and the barrier structure, the first encapsulation layer, second substrate, the filler layer, and the protection layer forms a package material, the barrier structure disposed between the first substrate and the package material and surrounding the environmental sensitive element.

2. The encapsulation method of the environment sensitive element as claimed in claim 1, wherein the getter layer has a continuous pattern or a discontinuous pattern.

3. The encapsulation method of the environmental sensitive element as claimed in claim 1, further comprising:
   forming the getter layer on the environmental sensitive element and the first rib before forming the first encapsulation layer to encapsulate the getter layer and the first rib, wherein a portion of the getter layer encapsulates the first rib and is located between the first rib and a portion of the first encapsulation layer.

4. The encapsulation method of the environmental sensitive element as claimed in claim 1, further comprising:
   forming a second encapsulation layer on the environmental sensitive element before forming the getter layer on the environmental sensitive element, wherein the getter layer is located between the second encapsulation layer and the first encapsulation layer.

5. The encapsulation method of the environmental sensitive element as claimed in claim 1, further comprising:
   forming a second rib on the second substrate after providing the second substrate, wherein the second rib surrounds the environmental sensitive element, and the second rib and the first rib are arranged alternately.

6. The encapsulation method of the environmental sensitive element as claimed in claim 1, wherein a material of the getter layer comprises a moisture absorption material.

7. The encapsulation method of the environmental sensitive element as claimed in claim 1, wherein a material of the first encapsulation layer comprises a polymer material.

8. The encapsulation method of the environmental sensitive element as claimed in claim 4, further comprising:

forming a second encapsulation layer on the environmental sensitive element and the first rib before forming the first encapsulation layer to encapsulate the getter layer and the first rib, wherein a portion of the second encapsulation layer encapsulates the first rib;

forming a second barrier layer on the portion of the second encapsulation layer located on the first rib after forming the second encapsulation layer, wherein the portion of the second encapsulation layer is located between the first rib and the second barrier layer; and forming the first encapsulation layer on the getter layer and the second barrier layer after forming the second barrier layer, wherein the portion of the first encapsulation layer is located between the first barrier layer and the second barrier layer.

9. The encapsulation method of the environmental sensitive element as claimed in claim 4, further comprising:

forming a second encapsulation layer on the environmental sensitive element and the first rib before forming the first encapsulation layer to encapsulate the getter layer and the first rib, wherein a portion of the second encapsulation layer encapsulates the first rib;

forming the getter layer on the second encapsulation layer located on the environmental sensitive element and the first rib after forming the second encapsulation layer; and forming the first encapsulation layer on the getter layer after forming the getter layer, wherein the portion of the first encapsulation layer is located between the first barrier layer and a portion of the getter layer.

10. A package of an environmental sensitive element, adapted to be folded along at least one fold line, the package of the environmental sensitive element comprising:

a first substrate;

a package material disposed above the first substrate;

a barrier structure disposed between the first substrate and the package material and surrounding the environmental sensitive element, the barrier structure comprises a rib and a barrier layer, the rib disposed on the first substrate and the barrier layer encapsulating the rib, wherein the package material encapsulates the barrier layer; the environmental sensitive element adapted to be folded along at least one fold line, the environmental sensitive element being disposed on the first substrate and located between the first substrate and the package material, wherein the package material encapsulates the environmental sensitive element; and a getter layer embedded in the package material, wherein the getter layer is not located on the fold line.

11. The package of the environmental sensitive element as claimed in claim 10, wherein the fold line is parallel to sidewalls of the first substrate.

12. The package of the environmental sensitive element as claimed in claim 10, wherein the fold line extends along a diagonal of the first substrate.

13. The package of the environmental sensitive element as claimed in claim 10, wherein the getter layer has a continuous pattern or a discontinuous pattern.

14. The package of the environmental sensitive element as claimed in claim 10, wherein a material of the getter layer comprises a moisture absorption material.

15. The package of the environmental sensitive element as claimed in claim 10, wherein the package material comprises a second substrate and a filling layer, wherein the filling layer is located between the first substrate and the second substrate, and encapsulates the environmental sensitive element.

16. The package of the environmental sensitive element as claimed in claim 10, wherein the package material comprises an encapsulation layer disposed on the getter layer and encapsulating the getter layer.

17. The package of the environmental sensitive element as claimed in claim 10, wherein the at least one fold line is located in an area occupied by the environmental sensitive element.

18. The package of the environmental sensitive element as claimed in claim 16, wherein the package material further comprises a protection layer disposed on the environmental sensitive element for directly encapsulating the environmental sensitive element, wherein the getter layer is located between the protection layer and the encapsulation layer.

19. The package of the environmental sensitive element as claimed in claim 16, wherein a material of the encapsulation layer comprises a polymer material.

* * * * *